(12) United States Patent
Yoong et al.

(10) Patent No.: US 11,480,866 B2
(45) Date of Patent: Oct. 25, 2022

(54) METHOD AND APPARATUS TO ANNEAL EUV MASK BLANK

(71) Applicant: Applied Materials, Inc., Santa Clara, CA (US)

(72) Inventors: Herng Yau Yoong, Singapore (SG); Wen Xiao, Singapore (SG); Ribhu Gautam, Singapore (SG); Sanjay Bhat, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 172 days.

(21) Appl. No.: 17/122,065

(22) Filed: Dec. 15, 2020

(65) Prior Publication Data
US 2022/0187697 A1 Jun. 16, 2022

(51) Int. Cl.
*G03F 1/24* (2012.01)
*G03F 1/60* (2012.01)
*G03F 1/44* (2012.01)

(52) U.S. Cl.
CPC ............... *G03F 1/24* (2013.01); *G03F 1/60* (2013.01); *G03F 1/44* (2013.01)

(58) Field of Classification Search
CPC .................................... G03F 1/24; G03F 1/60
USPC ............................................................ 430/5
See application file for complete search history.

(56) References Cited

U.S. PATENT DOCUMENTS

| 8,241,821 B2* | 8/2012 | Ikuta | G03F 1/24 |
| | | | 430/5 |
| 9,423,684 B2* | 8/2016 | Maeshige | G03F 1/24 |
| 9,618,836 B2* | 4/2017 | Kageyama | C23C 14/35 |

* cited by examiner

*Primary Examiner* — Christopher G Young
(74) *Attorney, Agent, or Firm* — Servilla Whitney LLC

(57) ABSTRACT

Apparatus and methods to improve centroid wavelength uniformity of EUV mask blanks are disclosed. The apparatus and methods may utilize one or more of heating the backside and/or the front side of the EUV mask blank. Selected regions and sub regions of the EUV mask blank are selectively heated, resulting in improved centroid wavelength uniformity of EUV mask blanks.

20 Claims, 8 Drawing Sheets

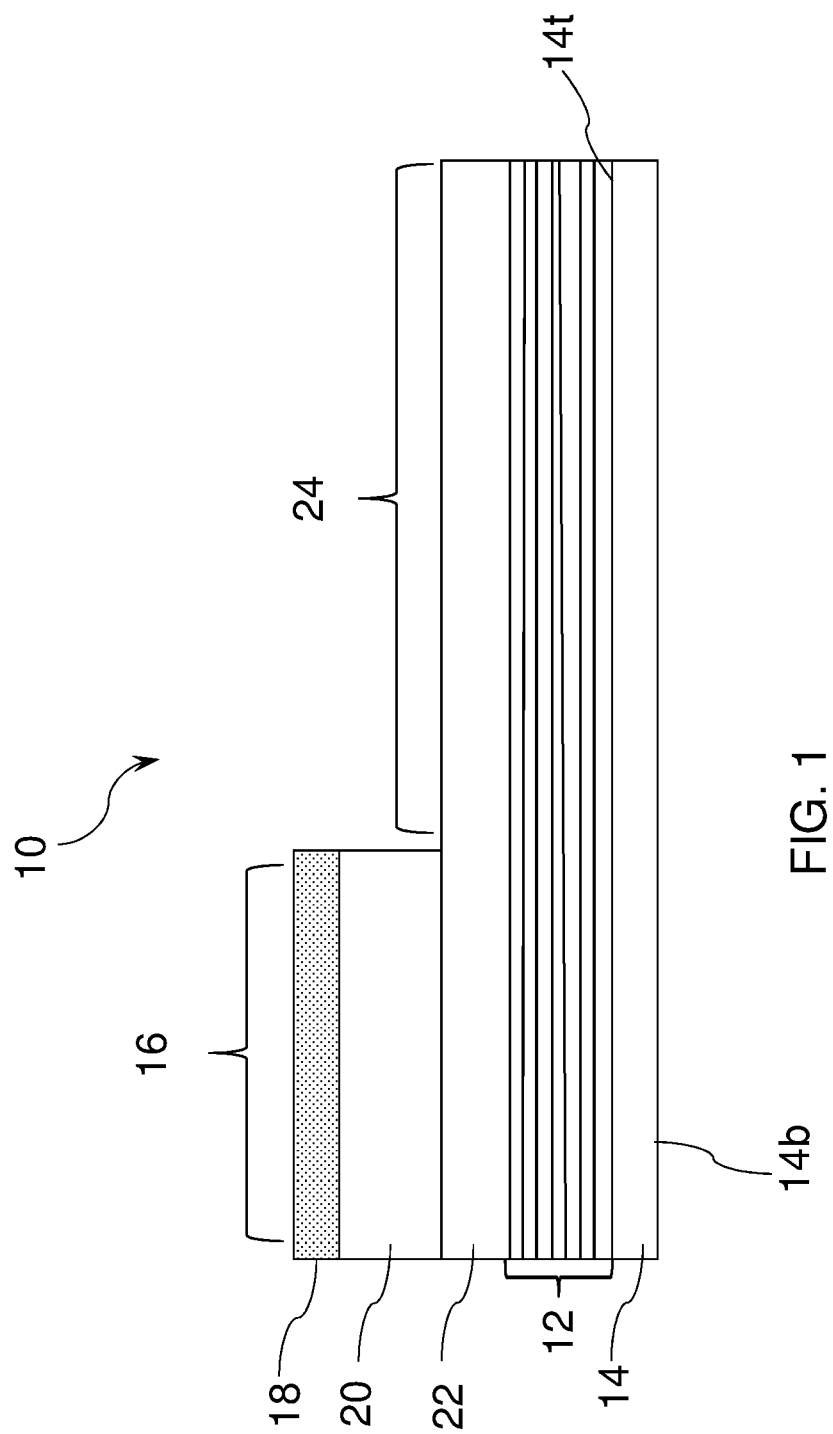

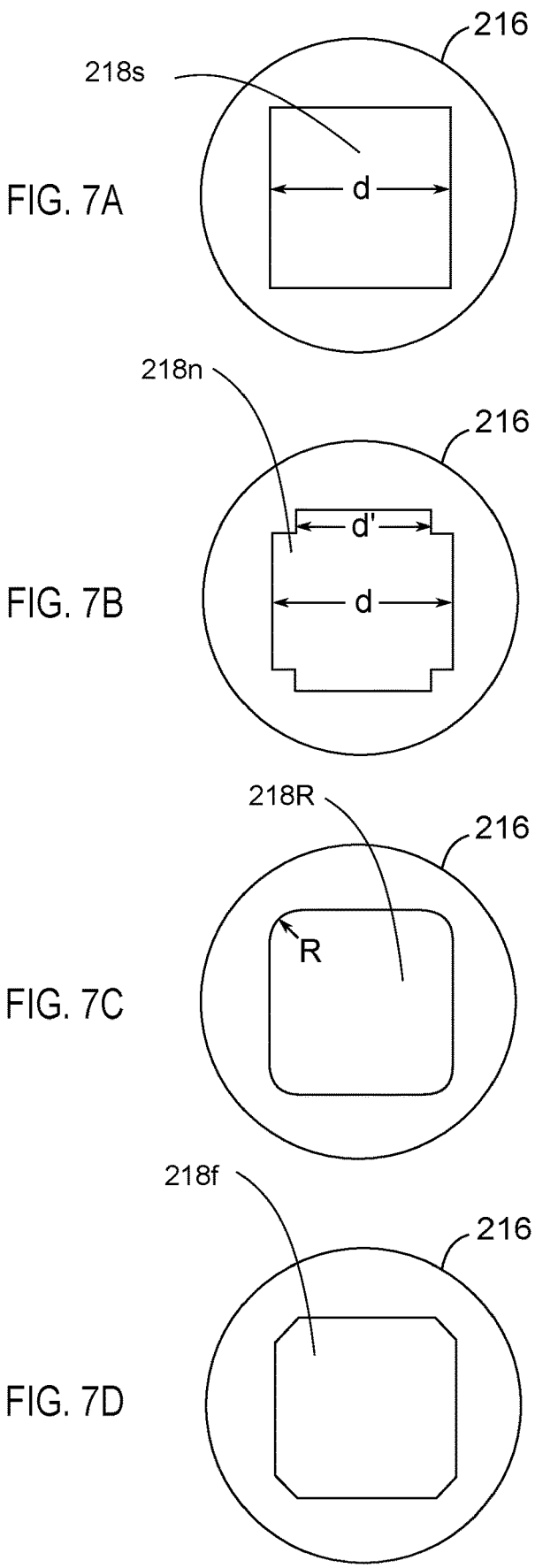

METHOD AND APPARATUS TO ANNEAL EUV MASK BLANK

TECHNICAL FIELD

The present disclosure relates generally to extreme ultraviolet lithography, and more particularly, apparatus and methods to anneal extreme ultraviolet mask blanks.

BACKGROUND

In extreme ultraviolet (EUV) lithography processes, the layout of an integrated circuit is transferred from an EUV mask onto a Si wafer surface via an EUV scanner. The quality of pattern transfer is highly dependent on uniformity of Mo/Si multilayer over the blank surface, which ultimately affects the yield of lithography process. The mask blank uniformity is usually specified by a few critical parameters, including the homogeneity in maximum reflectance (Rmax), centroid wavelength value (CWL50) and full width half maximum (FWHM).

There is a very stringent requirement on the uniformity of an EUV mask blank. The required non-uniformity (NU) of the centroid wavelength (CWL50) across the mask blank over a 132×132 mm$^2$ region is less than or equal to 0.015 nm. Through the use of a series of mirrors, or lens elements, and a reflective element, or mask blank, coated with a non-reflective absorber mask pattern, the patterned actinic light is reflected onto a resist-coated semiconductor substrate. An EUV reflective element operates on the principle of a distributed Bragg reflector. A substrate supports a multilayer (ML) mirror of 20-80 pairs of alternating layers of two materials, for example, molybdenum and silicon. Mo/Si multilayers are deposited in a multi-cathode (MC) physical vapor deposition (PVD) chamber, where multiple targets of are located in an off-center or off-angle relationship with respect to the substrate onto which the multilayers are deposited. The resultant off-angle deposition will induce non-uniformity in the deposited multilayers on the EUV mask blank substrate. In view of these increasingly stringent uniformity requirements, apparatus and systems are needed for the production of photomask blanks that provide improved uniformity.

SUMMARY

One or more embodiments of the disclosure are directed to method of manufacturing an extreme ultraviolet (EUV) mask blank comprising heating a measurement region area of the EUV mask blank including a top side having multi-layer stack which reflects EUV radiation, the measurement region area defined by a length and a width and comprising a plurality of sub regions, each of the plurality of sub regions comprising a sub region area smaller than that the measurement region area; and selectively heating at least one of the plurality of sub regions of the multilayer stack.

Additional embodiments of the disclosure are directed to apparatus configured to selectively heat a portion of an EUV mask blank, the apparatus comprising a chamber including a pedestal having a surface configured to support the EUV mask blank; a radiation source positioned and configured to direct radiation toward the surface configured to support the EUV mask blank; and a controller configured to control the radiation source to selectively direct heat toward a first region of the surface configured to support the EUV mask blank to a first temperature while maintaining a second region of the surface configured to support the EUV mask blank at a second temperature lower than the first temperature, the controller configured to execute a selective heating process based on a centroid wavelength non-uniformity profile of the EUV mask blank.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 schematically illustrates an EUV reflective mask;

FIG. 7A is a top view of a top view of a carrier top shield with a square corner;

FIG. 7B is a top view of a top view of a carrier top shield with in the shape of an irregular polygon;

FIG. 7C is a top view of a top view of a carrier top shield with in the shape of a square with rounded corners;

FIG. 7D is a top view of a top view of a carrier top shield with in the shape of a square with flattened corners or in the shape of an irregular octagon.

DETAILED DESCRIPTION

Figure 2A:
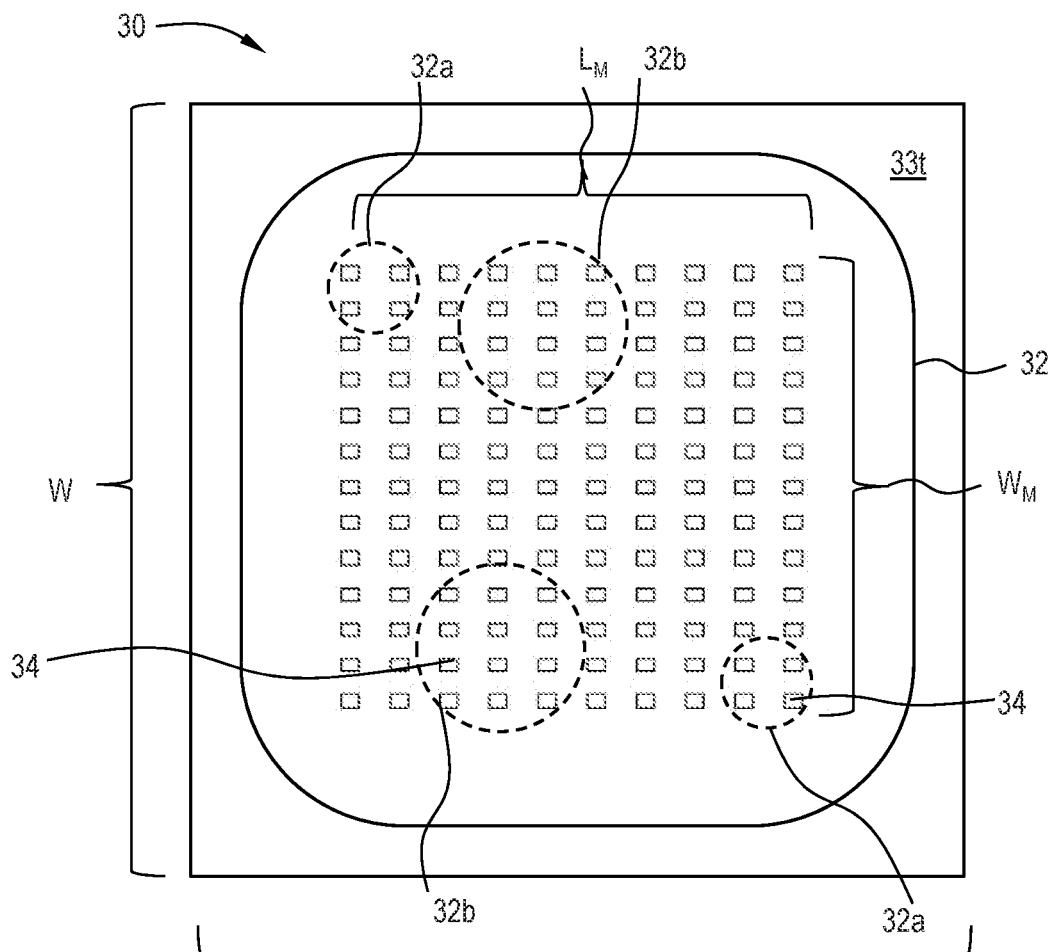
FIG. 2A is a top view of an EUV mask blank shown a measurement area and regions and sub regions.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate refers to only a portion of the substrate, unless the context clearly indicates otherwise. Additionally, reference to depositing on a substrate means both a bare substrate and a substrate with one or more films or features deposited or formed thereon.

FIG. 1 shows an EUV reflective photomask 10, which is manufactured from an EUV mask blank. The EUV reflective photomask 10 includes a reflective multilayer stack 12 on a substrate 14. The flat substrate 14 comprising a top side 14t and a bottom side 14b in some embodiments comprises a low expansion glass (e.g., ULE glass)) substrate having lateral dimensions of 6 inches×6 inches (152 mm×152 mm) and a thickness of 0.25 inches (6.3 mm). The reflective multilayer stack reflects EUV radiation (e.g., from 12.5 to 14.5 nm, such as 13.5 nm) at unmasked areas by Bragg interference. The multilayer stack 12 comprises alternating layers of a first material layer (e.g., molybdenum (Mo)) and a second material layer (e.g., silicon (Si)) to provide a reflective layer pairs that reflect EUV radiation. There are generally 20-80 reflective layer pairs. Masked (non-reflective) areas 16 of the EUV reflective photomask 10 are formed by etching buffer layer 18 and absorber layer 20. The absorber layer 20 typically has a thickness in a range of 51 nm to 77 nm. A capping layer 22 112 (e.g., ruthenium (Ru)) is formed over the reflective multilayer stack 12 and protects the reflective multilayer stack 12 during the etching process. EUV mask blanks are made the substrate 14 by coating the top side 14t of the substrate 14 with the reflective multilayer stack 12, the capping layer 22 and the absorber layer 20, which is then etched to provide the masked (non-reflective) areas 16 and reflective areas 24. The absorber layer 20 comprises a material such as tantalum or a tantalum-containing material which absorbs EUV radiation.

Considering the size of substrates that are used to manufacture EUV reflective elements, deposition of multilayer stacks without any small non-uniformities is extremely challenging. For example, EUV mask blanks are formed from large (e.g., typically six-inch square L×W or diameter) low expansion substrates. Referring to FIG. 2A, an EUV mask blank 30 is shown having an overall length L and width W, which is typically 6 inches×6 inches (152 mm×152 mm). EUV mask blanks include a region of interest or measurement region 32, which is the area in which a mask pattern is printed on the mask, and the length and width of this measurement region 32 is typically 132 mm×132 mm. The EUV mask blank 30 includes a measurement region area defined by measurement region length $L_M$ and a measurement region width $W_M$. The EUV mask blank 30 includes a top side 33t having multilayer stack formed thereon as shown in the mask in FIG. 1, which reflects EUV radiation, the measurement region area defined by the measurement region length $L_M$ and the measurement region width $W_M$.

Still referring to FIG. 2A, the EUV mask blank further comprises a plurality of sub regions 32a and 32b, each of the plurality of sub regions 32a, 32b comprising a sub region area (defined by the dotted lines surrounding the sub regions 32a, 32b) smaller than that the measurement region area defined by the measurement region length $L_M$ and the measurement region width $W_M$. As can be seen in FIG. 2A, the sub regions 32a comprise a smaller area than sub regions 32b. The sub regions 32a include four measurement positions 34, and the sub regions 32b comprise twelve measurement positions 34. The sub region sizes and number of measurement positions are exemplary only. For example, in the embodiment shown, there are 130 measurement positions 34 shown. There can be a greater or lesser number of measurement positions. In one or more embodiments, there can be a range of from 10-50 measurement positions, 20-50 measurement positions, 50-100 measurement positions, 50-200 measurement positions, or 50-300 measurement positions. The reflectivity is measured at each of the measurement positions using an EUV reflectometer, for example, available from EUV Tech, Martinez, Calif. (https://www.euvtech.com/euv-reflectometer-1).

Figure 2B:
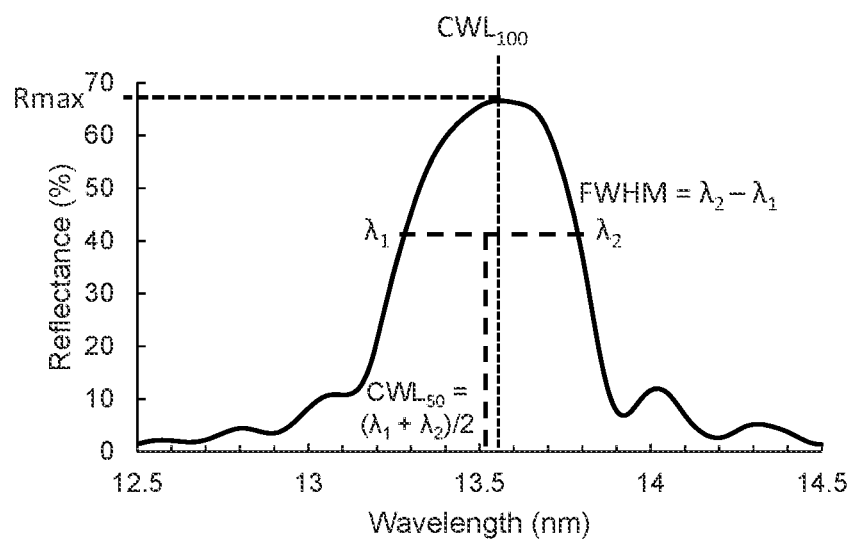
FIG. 2B is a graph of reflectance versus wavelength for an EUV mask blank.

The fabrication tolerances for lithographic quality mask blanks require reflectivity uniformity in the range of ±0.1%, and a centroid wavelength variation of a few tenths of an Angstrom. FIG. 2B is a graph illustrating centroid wavelength (CWL) values. Using EUV reflectometer measurements at a plurality of measurement positions 34, an CWL non-uniformity profile or CWL non-uniformity map is obtained for the measurement region 32 of an EUV mask blank 30. As shown in the graph of FIG. 2B, peak reflectivity is used to obtain the $CWL_{100}$, and the centroid wavelength ($CWL_{50}$) is determined at the full width half maximum (FWHM) determined by the formula $(\lambda_1+\lambda_2)/2$, where $\lambda_1$ and $\lambda_2$ are the wavelengths at the FWHM. The non-uniformity (NU) of a centroid wavelength (CWL) across the entire EUV mask blank should be less than 0.04 nm, and the non-uniformity (NU) of the centroid wavelength ($CWL_{50}$) across the mask blank over the 132×132 mm² measurement region 32 for EUV mask blanks made using one or more embodiments of the apparatus described herein is less than or equal to 0.015 nm.

Figure 3A:
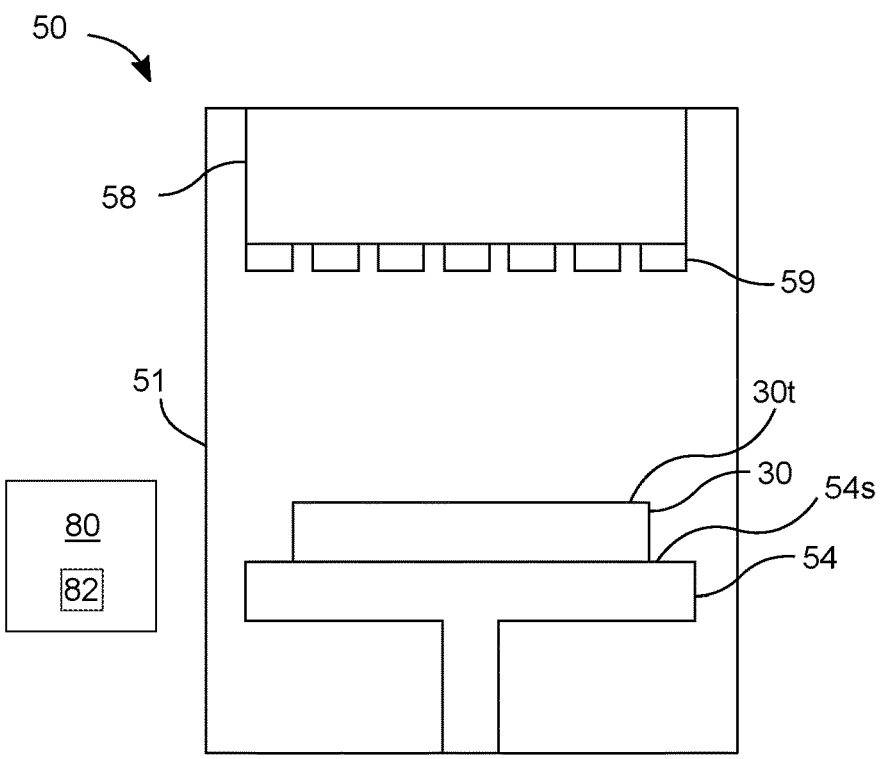
FIG. 3A is a cross-sectional view of substrate processing chamber according to one or more embodiments.
Figure 3B:
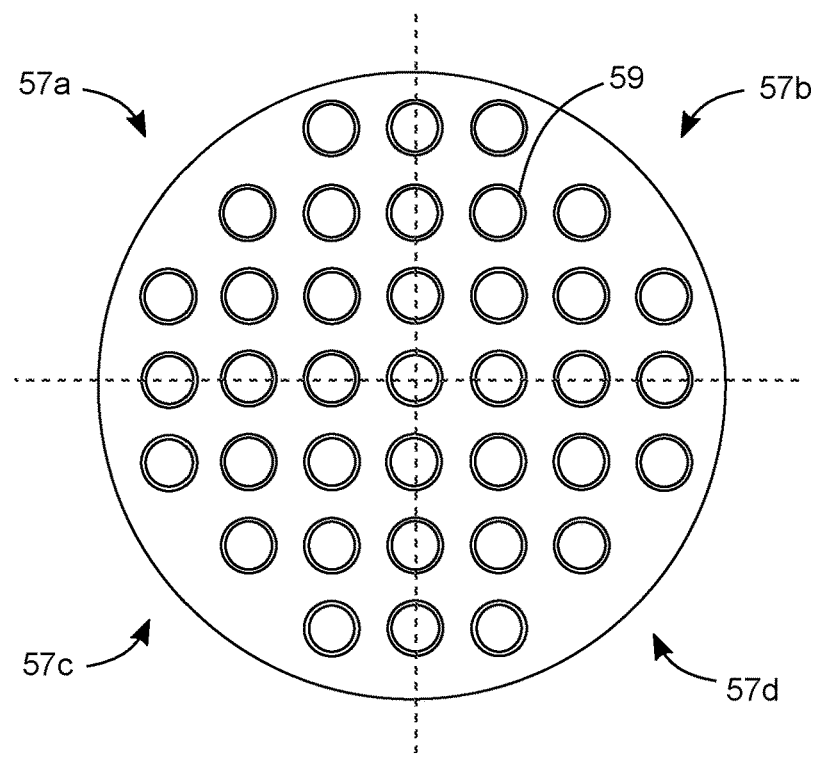
FIG. 3B is a bottom view of a heating element according to one or more embodiments.

Referring now to FIGS. 3A and 3B, an embodiment of an apparatus 50 configured to selectively heat a portion of an EUV mask blank 30, is shown. The apparatus comprises a chamber 51 including a pedestal 54 having a surface 54s configured to support the EUV mask blank 30. The apparatus as shown comprises a radiation source shown as a top side radiation source 58 positioned and configured to direct radiation toward the surface 54s configured to support the EUV mask blank 30. In the embodiment shown, when the EUV mask blank 30 is supported on the surface 54s configured to support the EUV mask blank 30, the top side radiation source 58 is positioned above the pedestal 54 and the radiation is directed at a top side 30t of the EUV mask blank 30.

The apparatus 50 further comprises a controller 80 configured to control the radiation source 58 to selectively direct heat toward a first region of the surface 54s configured to support the EUV mask blank 30 to a first temperature while maintaining a second region of the surface 30s configured to support the EUV mask blank 30 at a second temperature lower than the first temperature. In some embodiments, the controller 80 is further configured to execute a selective heating process based on a centroid wavelength non-uniformity profile or map of the EUV mask blank.

In FIGS. 3A and 3B, the top side radiation source 58 is configured to selectively direct heat toward the first region the surface 54s configured to support the EUV mask blank 30 and to heat to the first temperature while maintaining the second region of the surface configured to support the EUV mask blank at the second temperature. The top side radiation source 58 is in communication with the controller 80, which is further configured to send instructions for the top side radiation source 58 to selectively direct the heat.

As shown in FIG. 3B, the top side radiation source 58 comprises an array of radiation sources 59 in the form of laser diodes or heat lamps directed at the top side 30t. In the simplified embodiment shown, there are four separate portions 57a, 57b, 57c, and 57d of the array of radiation sources 59 comprising the top side radiation source 58. The portions 57a, 57b, 57c and 57d are shown as being divided in quadrants, but this illustration is exemplary only. In some embodiments, there can be any suitable number of portions of the array of radiation sources 59. The portions can correspond to the number of measurement positions 34 shown in FIG. 2A and/or the sub regions 32a, 32b shown in FIG. 2A.

In one or more embodiments, a first portion of the array of radiation sources 59 is separately controllable from a second portion of the array of radiation sources 59 by the controller 80. In particular embodiments, selected sub regions 32a, 32b and/or measurement positions are selectively heated by the top side heat source based on an CWL non-uniformity profile or CWL non-uniformity map is obtained for the measurement region 32 of an EUV mask blank 30. By selectively heating regions of interest based on CWL non-uniformities across the surface of the EUV mask blank 30, the CWL non-uniformity can be improved. For example, a first measurement position and/or sub region may comprise a centroid wavelength (CWL) value that is elevated relative to a CWL value in a second measurement position and/or sub region such that that there is a CWL non-uniformity value. By utilizing the apparatus 50 shown in FIGS. 3A and 3B, CWL non-uniformities are reduced by selectively heating sub regions and/or measurement positions.

In some embodiments, the EUV mask blank 30 is scanned by an EUV reflectometer in the chamber 51, and he controller 80 implements a heating schedule or process to selectively heat sub regions and/or measurement positions of interest that require adjustment based on the CWL profile. In other embodiments, an EUV reflectometer is utilized offline and outside the chamber 51 to obtain a CWL non-uniformity profile or a CWL non-uniformity map of the EUV mask blank 30 to be processed in the chamber 51. The CWL non-uniformity profile or CWL non-uniformity map of the EUV mask blank 30 to be processed in the chamber 51 is then communicated to the controller 80, and the CWL non-uniformity profile or CWL non-uniformity map of the EUV mask blank 30 can be stored in the memory 82. The controller can then execute a selective heating process by selectively activating portions of the array of radiation sources 59 to change the CWL value of selected sub regions or measurement positions of the EUVE mask blank. In some embodiments, the controller is configured to control the top side radiation source 58 to selectively heat more than one of the plurality of sub regions of multilayer stack of the EUV mask blank 30.

In embodiments in which the array of radiation sources 59 comprises laser diodes, the wavelength of the laser diodes of some embodiments is in a range of 700 nm-1 mm. The laser diodes can be an Infrared laser. In one or more embodiments, the laser can operate in a continuous or pulsed mode. In embodiments in which the laser diode operates in a continuous mode, the dwell time of the laser is in a range of from 0.1-2.0 milliseconds. In embodiments in which the laser diode operates in a pulsed mode, the dwell time of the laser is in a range of from 10-100 nanoseconds.

In embodiments in which the array of radiation sources 59 comprises heating lamps, the heating lamps can comprise halogen lamps or broadband white light lamps.

Figure 4A:
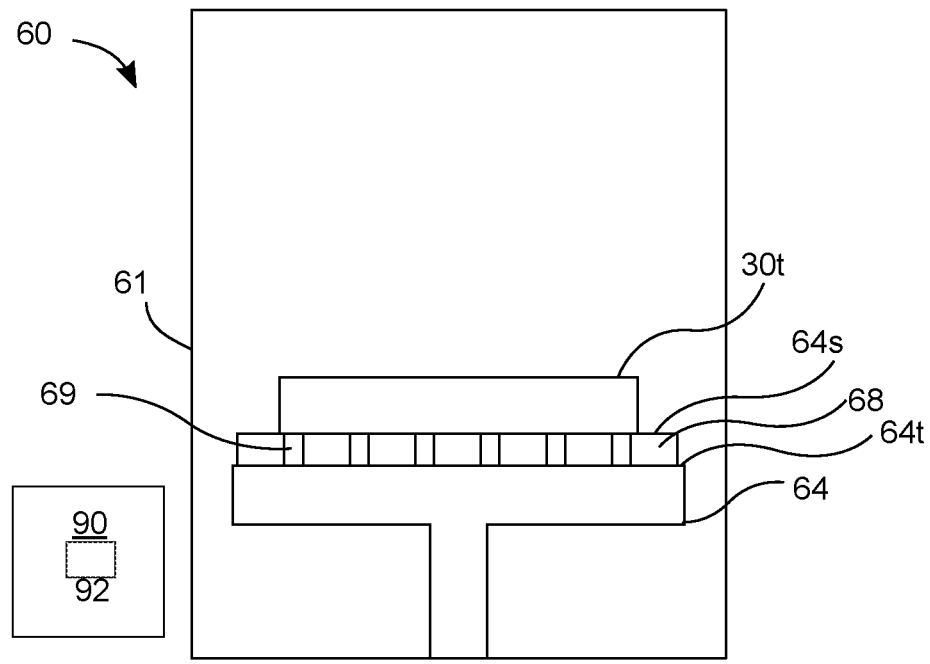
FIG. 4A is a cross-sectional view of substrate processing chamber according to one or more embodiments.
Figure 4B:
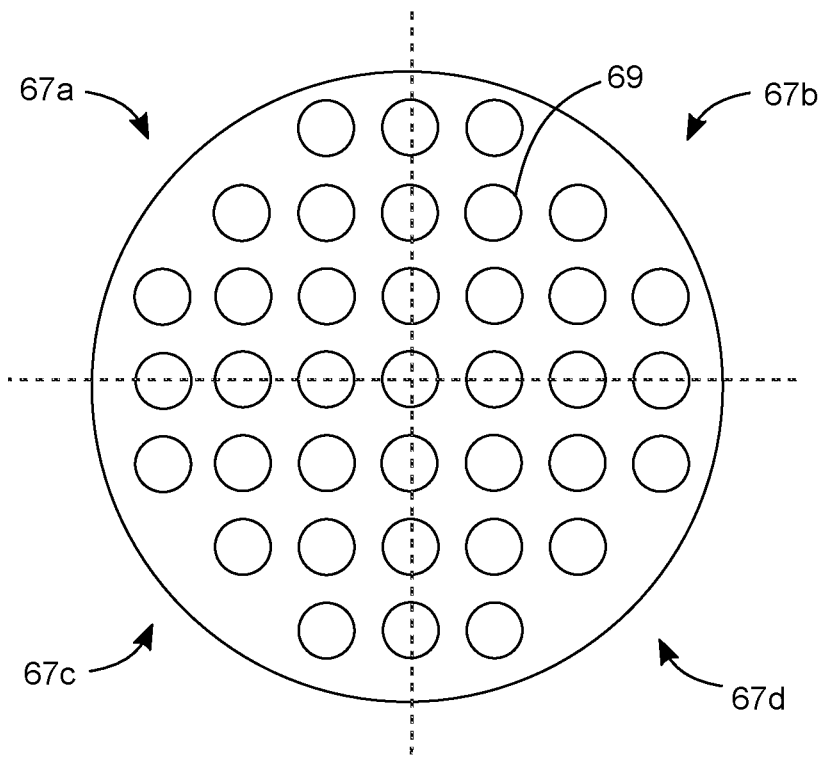
FIG. 4B is a top view of a heating element in the substrate processing chamber of FIG. 4A.

FIGS. 4A and 4B illustrate a second embodiment of an apparatus 60 configured to selectively heat a portion of an EUV mask blank 30. The apparatus 60 comprises a chamber 61 including a pedestal 64 having a surface 64s configured to support the EUV mask blank 30. The apparatus as shown comprises a pedestal radiation source 68 positioned and configured to direct radiation toward the surface 64s configured to support the EUV mask blank 30. In the embodiment shown, when the EUV mask blank 30 is supported on the surface 64s configured to support the EUV mask blank 30, the pedestal radiation source 68 is positioned on a top surface 64t of the pedestal 64 as shown. Alternatively, the pedestal 64 can comprise a pedestal radiation source embedded in or integral with the pedestal. In either case, the pedestal radiation source 68 is configured to heat the surface 64s configured to support the EUV mask blank 30.

In particular, the pedestal radiation source 68 is configured to selectively direct heat toward the first region the surface 64s configured to support the EUV mask blank heat to the first temperature while maintaining the second region of the surface 64s configured to support the EUV mask blank at the second temperature, the pedestal radiation source 68 in communication with a controller 90, which is further configured to send instructions for the pedestal radiation source 68 to selectively direct the heat. In some embodiments, the controller 90 is further configured to execute a selective heating process based on a centroid wavelength non-uniformity profile or map of the EUV mask blank.

In FIGS. 4A and 4B, pedestal radiation source 68 is configured to selectively direct heat toward the first region the surface 64s configured to support the EUV mask blank 30 and to heat to the first temperature while maintaining the second region of the surface 64s configured to support the EUV mask blank at the second temperature. The pedestal radiation source 68 is in communication with the controller 90, which is further configured to send instructions for the pedestal radiation source 68 to selectively direct the heat.

As shown in FIG. 4B, the pedestal radiation source 68 comprises an array of heating elements 69 in the form of resistance heating elements. In the simplified embodiment shown, there are four separate portions 67a, 67b, 67c, and 67d of the array of heating elements 69 comprising the pedestal radiation source 68. The portions 67a, 67b, 67c and 67d are shown as being divided in quadrants, but this illustration is exemplary only. In some embodiments, there can be any suitable number of portions of the array of heating elements 69. The portions can correspond to the number of measurement positions 34 shown in FIG. 2A and/or the sub regions 32a, 32b shown in FIG. 2A.

In one or more embodiments, a first portion of the array of heating elements 69 is separately controllable from a second portion of the array of heating elements 69 by the controller 90. In particular embodiments, selected sub regions 32a, 32b and/or measurement positions are selectively heated by pedestal radiation source 68 based on an CWL non-uniformity profile or CWL non-uniformity map is obtained for the measurement region 32 of an EUV mask blank 30. By selectively heating regions of interest based on CWL non-uniformities across the surface of the EUV mask blank 30, the CWL non-uniformity can be improved. For example, a first measurement position and/or sub region may comprise a centroid wavelength (CWL) value that is elevated relative to a CWL value in a second measurement position and/or sub region such that that there is a CWL non-uniformity value. By utilizing the apparatus 60 shown in FIGS. 4A and 4B, CWL non-uniformities are reduced by selectively heating sub regions and/or measurement positions.

In some embodiments, the EUV mask blank 30 is scanned by an EUV reflectometer in the chamber 61, and he controller 90 implements a heating schedule or process to selectively heat sub regions and/or measurement positions of interest that require adjustment based on the CWL profile. In other embodiments, an EUV reflectometer is utilized offline and outside the chamber 61 to obtain a CWL non-uniformity profile or a CWL non-uniformity map of the EUV mask blank 30 to be processed in the chamber 61. The CWL non-uniformity profile or CWL non-uniformity map of the EUV mask blank 30 to be processed in the chamber 61 is then communicated to the controller 90, and the CWL non-uniformity profile or CWL non-uniformity map of the EUV mask blank 30 can be stored in the memory 92. The controller can then execute a selective heating process by selectively activating portions of the array of heating elements 69 to change the CWL value of selected sub regions or measurement positions of the EUVE mask blank. In some embodiments, the controller 90 is configured to control the pedestal radiation source 68 to selectively heat more than one of the plurality of sub regions of multilayer stack of the EUV mask blank 30.

The chamber 51 shown in FIG. 3A and the chamber 61 in FIG. 4A is configured to heat in a temperature range of from 100° C. to 350° C., from 100° C. to 300° C., or from 100° C. to 250° C. The chamber 51 and the chamber 61 of one or more embodiments is configured operation in a high vacuum condition, for example in a range of from $10^{-6}$ to $10^{-7}$ Torr or in a low vacuum condition, for example, the chamber filled with inert gas to 1 Torr. The controller 80 or controller 90 is configured to operate the chamber at these aforementioned temperatures and pressures. The controller 80 or the controller 90 is further configured to anneal an EUV mask blank for a range of time from five minutes to 60 minutes until a CWL uniformity profile is achieved, for example, so that there is a non-uniformity (NU) of the centroid wavelength (CWL50) across the mask blank over a 132×132 mm² region is less than or equal to 0.015 nm.

Figure 5A:
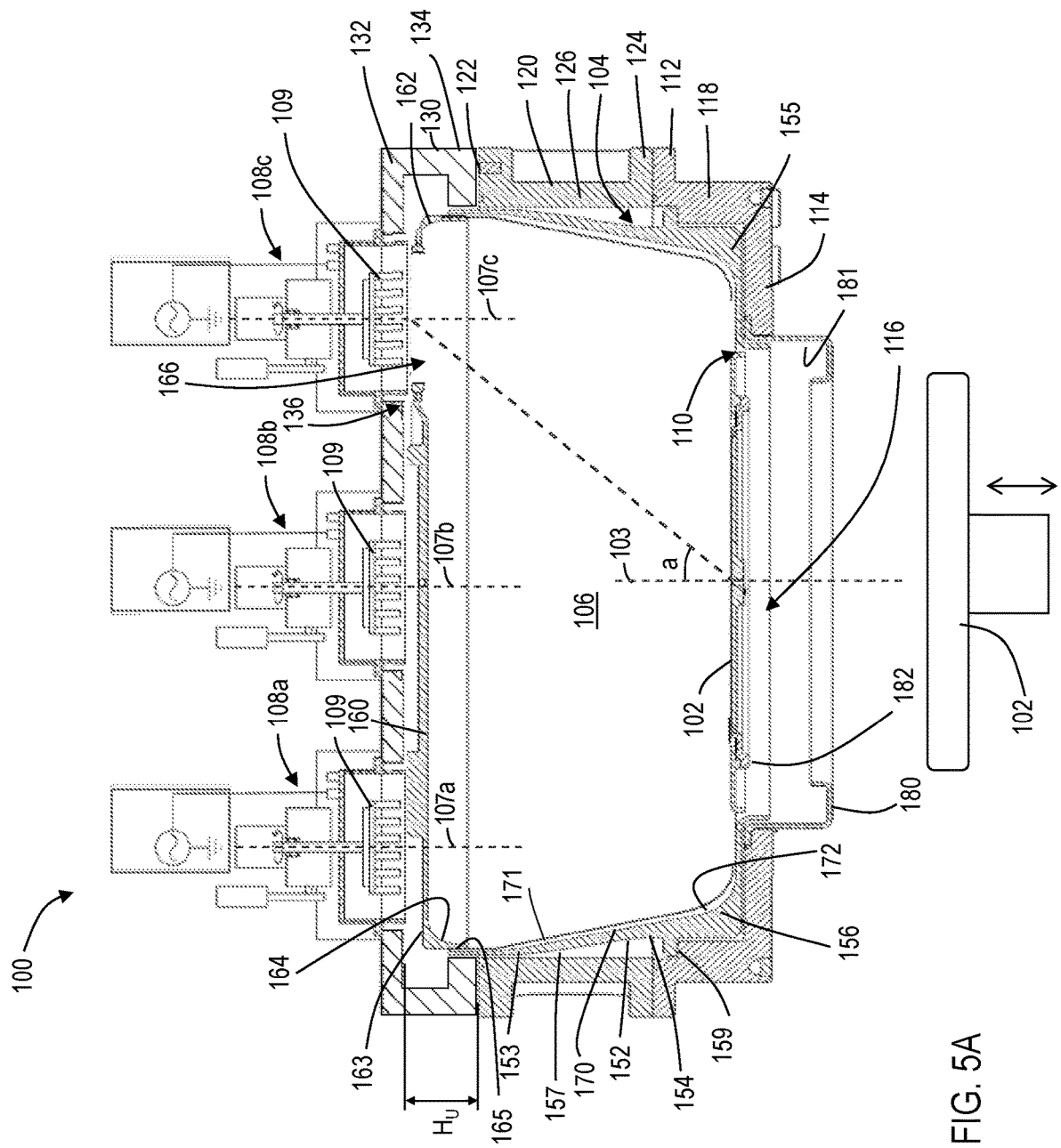
FIG. 5A is a cross-sectional view of a PVD substrate processing chamber according to one or more embodiments.
Figure 5B:
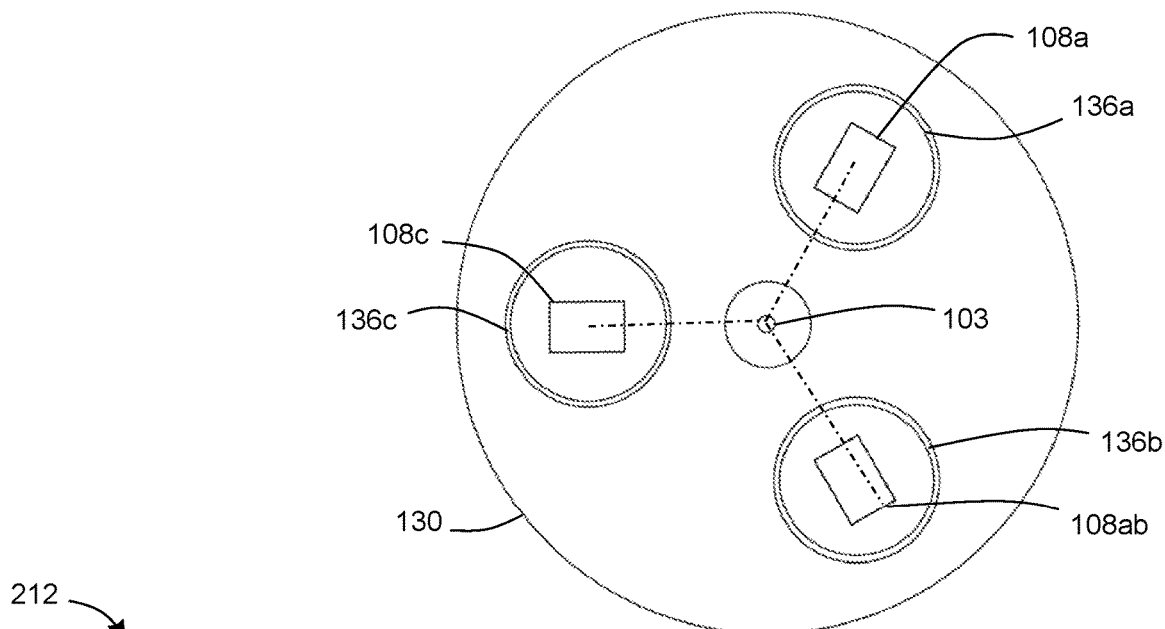
FIG. 5B is a top view of the PVD substrate processing chamber shown in FIG. 5A

It has been determined that a source of CWL non-uniformities occur in multi-cathode PVD substrate processing chambers in which there is off-axis deposition with respect to the cathodes and the substrate. A PVD substrate processing chamber 100 is depicted in FIG. 5A, in which a side view of a portion of the PVD substrate processing chamber 100 is shown. The PVD substrate processing chamber comprises a chamber floor 110, a chamber housing 120 and a chamber upper plate 130. The chamber floor 110 has a circular shape with an open top 112, a closed bottom 114 and sidewalls 118 therebetween. The chamber floor 110 further includes an opening 116 through which a substrate support 102 passes through. The chamber housing 120 has a cylindrical body with an open top 122, an open bottom 124 and sidewalls 126 therebetween. The chamber upper plate 130 has a cylindrical shape with a closed top 132 and an open bottom 134. The closed top 132 has one or more openings 136 for receiving a cathode assembly or one or more targets as explained in further detail below. In some embodiments, the chamber floor 110 and chamber housing 120 form a unitary body. In some embodiments, the chamber floor 110 and chamber housing 120 are separate components which, when assembled, are sealed with at least one O-ring or gasket positioned between the open top 112 of the chamber floor 110 and the open bottom 124 of the chamber housing 120. The chamber upper plate 130 is removably assembled with the chamber housing 120 to allow for the installation or removal of components of the process kit 150. When assembled, the chamber housing 120 and the chamber upper plate 130 are sealed with at least one O-ring or gasket positioned between the open top 122 of the chamber housing 120 and the open bottom 134 of the chamber upper plate 130.

The chamber floor 110, chamber housing 120 and chamber upper plate 130 define a chamber volume 104 in which one or more components of a process kit 150 are disposed within. In the present embodiment the process kit 150 includes at least a chamber liner 152 having a bowl-shaped body 154 and a concave inner surface 156 and a rotatable shield 160 having a substantially cylindrical body 162 and an inner surface 164, which in some embodiments is a concave inner surface 164. In some embodiments, the process kit 150 further includes an inner chamber liner 170 having a sloped wall 171 joined to an inner surface 172. In some embodiments, the inner surface is concave. It will be appreciated that each of the inner surface 164 of the rotatable shield, the chamber liner 152 concave inner surface 156 and the inner surface 172 of the chamber liner have a concave surface, which includes a sloped surface and/or a curved surface. These concave surfaces included a sloped surface and/or a curved surface are not coated uniformly in the PVD substrate processing chamber 100 because the PVD substrate processing chamber 100 is configured to uniformly coat a substrate such as an EUV mask blank or wafer comprising a substantially flat surface placed on the substrate support. In some embodiments, the process kit 150 further includes an upper shield (not shown), a lower shield 180, a telescopic cover ring 182 and one or more intermediate shields (not shown). The lower shield 180 abuts the partially closed bottom 155 of the chamber liner 152.

The bowl-shaped body 154 of the chamber liner 150 has an open top 153 and an at least partially closed bottom 155, the at least partially closed bottom 155 in contact with the closed bottom 114 of the chamber floor 110. The rotatable shield 160 has an at least partially closed top 163 and an open bottom 165. The rotatable shield 160 has a height $H_S$ defined by the closed top 163 and open bottom 165. The open top 153 of the chamber liner 152 creates a sealed environment with an open bottom 165 of the rotatable shield 160, the sealed environment defining the processing volume 106.

One or more components of the process kit 150 define a processing volume 106 in which deposition on a substrate (such as the EUV mask blank 30) placed on the substrate support 102 occurs. In the present embodiment, the processing volume 106 is defined by the chamber liner 152 of the processing kit 150 and the rotatable shield 160 of the processing kit 150. A processing volume height $H_P$ is defined from the partially closed bottom 155 of the chamber liner 152 to the partially closed top 163 of the rotatable shield 160. To accommodate the processing volume height $H_P$, the chamber upper plate 130 of the PVD substrate processing chamber has a height $H_U$ and is sized such that the least partially closed top 163 of the rotatable shield 160 is in contact with the closed top 132 of the chamber upper plate.

In the embodiment shown, the PVD substrate processing chamber 100 is configured as a multi-cathode PVD substrate processing chamber including a multi-target PVD source configured to manufacture an MRAM (magnetoresistive random access memory) or a multi-target PVD source configured to manufacture an extreme ultraviolet (EUV) mask blank. At least one cathode assembly 108 is positioned over the one or more openings 136 of the chamber upper plate 130. In some embodiments, one or more targets 109 is positioned within the one or more openings 136 of the chamber upper plate 130. In some embodiments, the one or more targets 109 is positioned within the one or more openings 136 of the chamber upper plate 130 and under the at least one cathode assembly 108 positioned over the one or more openings 136. In some embodiments, the rotatable shield 160 of the process kit 150 is formed with the shield holes 166 so that the cathode assemblies 108 in some embodiments are used to deposit the material layers through the shield holes 166. Each of the cathode assemblies 108 is connected to a power supply (not shown) including direct current (DC) or radio frequency (RF).

The rotatable shield 160 is configured to expose one of the cathode assemblies 108 at a time and protect other cathode assemblies 108 from cross-contamination. The cross-contamination is a physical movement or transfer of a deposition material from one of the cathode assemblies 108 to another of the cathode assemblies 108. The one or more targets 109 in some embodiments are any suitable size. For example, each of the one or more targets 109 in some embodiments has a diameter in a range of from about 4 inches to about 20 inches, or from about 4 inches to about 15 inches, or from about 4 inches to about 10 inches, or from about 4 inches to about 8 inches or from about 4 inches to about 6 inches.

The substrate support 102 is configured to move vertically move up and down. The lower shield 180 is sized and shaped to account for the travel of the substrate support 102 while still in the chamber.

When the material layers are sputtered onto an EUV mask blank 30 placed on the substrate support 102, the materials sputtered from the one or more targets 109 having a central axis (107a, 107b, 107c) which are off axis with a center axis 103 of the substrate support by an angle a. This off axis deposition results in non-uniformity of deposition that results in CWL non-uniformities.

Figure 6A:
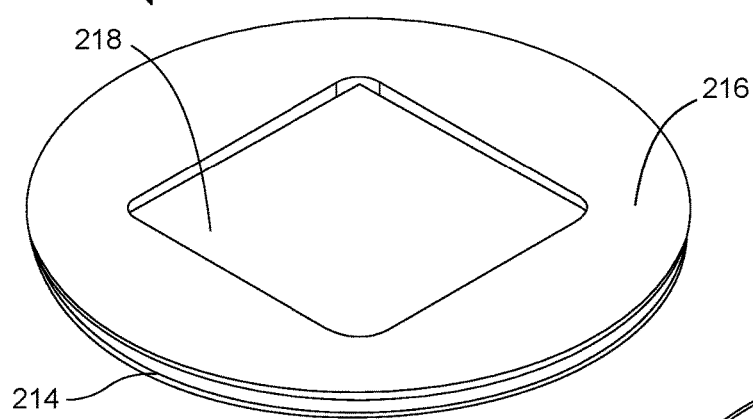
FIG. 6A is an isometric view of a EUV mask blank carrier assembly.
Figure 6B:
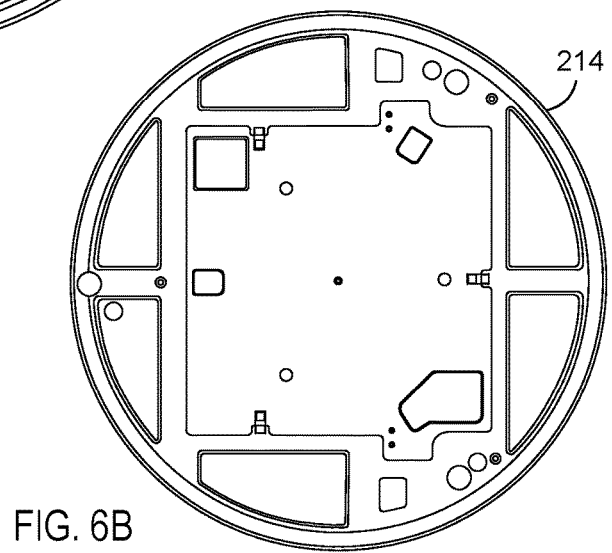
FIG. 6B is a top view of the carrier base of the EUV mask blank carrier assembly shown in FIG. 4A.

Referring now to FIGS. 6A and 6B, an EUV mask blank carrier assembly 212 is utilized to transport an EUV mask blank 30 to the PVD substrate processing chamber 100 for a deposition process. The EUV mask blank carrier assembly comprises a top shield 216 with an opening 218 therein sized and configured to hold an EUV mask blank 30 during a deposition process in the PVD substrate processing chamber 100. A bottom plate 214 supports the EUV mask blank 30.

As discussed above, an EUV mask blank has a length× width of 6 inches×6 inches (152 mm×152 mm). FIG. 7A shows a conventional top shield 216 having a square opening 218s with a constant dimension d. As shown in FIG. 7C, according to one or more embodiments, the top shield 216 has a rounded opening 218R having a radius of curvature R at each corner. The radius of curvature in one or more embodiments is in a range of from 1-10 mm, from 1-6 mm, for example, 1 mm, 2 mm, 3 mm, 4 mm, 5 mm, 6 mm, 7 mm, 8 mm, 9 mm or 10 m. According to one or more embodiments, a shield opening 218R that is not square will introduce enhanced scattering effects especially at the corners and edges of the EUV mask blank, which will help to improve the thickness distribution of the deposited material at the corners/edges of the EUV mask blank. The profile of the corner of the opening 218R can be optimized to address regions of interest according to the different deposition profiles that are obtained from individual deposition chambers.

In some embodiments, when an EUV mask blank 30 is placed on an EUV mask blank carrier assembly 212 for transport to an apparatus configured to selectively heat the EUV mask blank such as the chambers 51 and 61 respectively shown in FIG. 3A and FIG. 4A, different top shield opening profiles can be used to impact the annealing process. For example, if a uniform heating process is desired, a square opening 218s will be used. However, in FIG. 7B a nonuniform opening 218n is shown, which the dimension d' is less than dimension d of the opening 218n. This profile results in an irregular polygon shaped opening, and in particular a cross dodecagon, or a twelve-sided cross. When a square EUV mask blank is placed in this opening 218n, there will be a gap between the edge of the EUV mask blank and the opening 218 n. This will result in a non-uniform irradiation heating profile of the EUV mask blank during a heating process. Depending on the extent of the non-uniformity, d and d' can be different for each of the four edges of the top shield opening 218n. Custom heating profiles can be achieve by changing the dimensions d and d'.

FIG. 7D shows another example of an opening 218f with flattened corners to provide a polygon with greater than four sides. In the embodiments shown, the opening 218f comprises eight sides. Different top shield designs may be used for deposition processes to form the EUV mask blank layers and annealing processes. In some embodiments, the top shield opening is the same for deposition and heating processes. In other embodiments, different top shield opening shapes are used in the deposition and heating processes.

Figure 8:
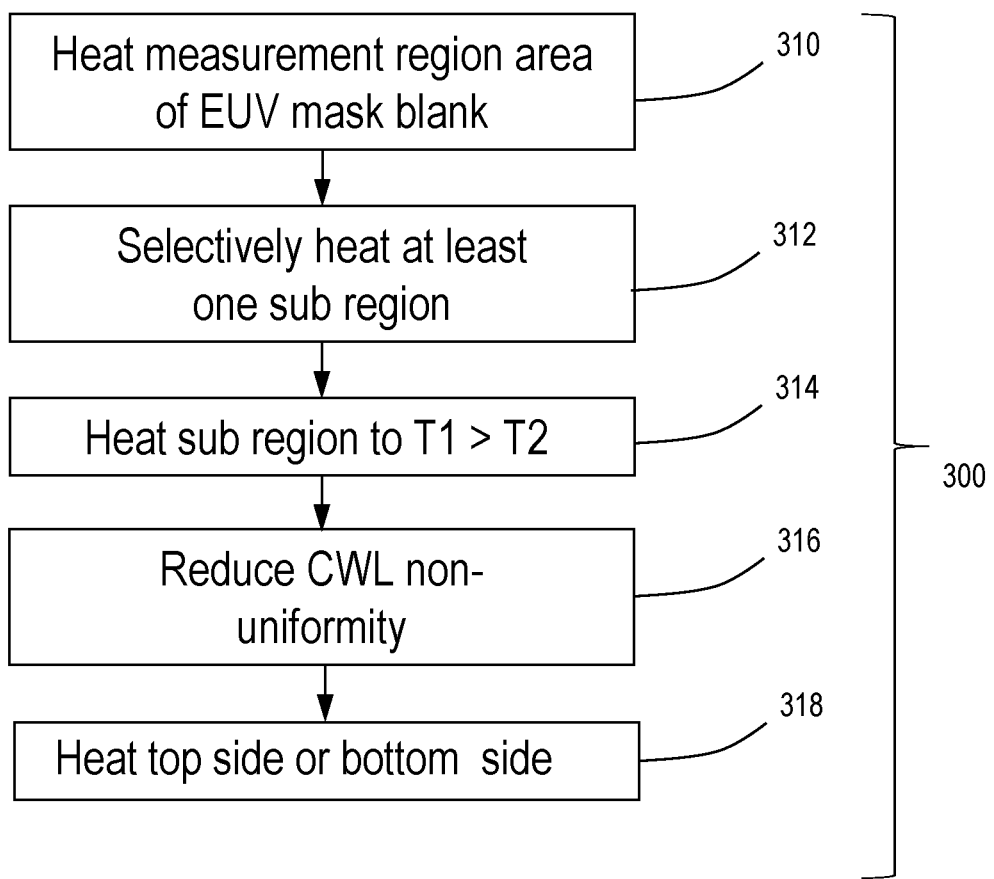
FIG. 8 is a flow chart showing a method according to an embodiment of the disclosure.

As shown in FIG. 8, a method 300 of manufacturing an extreme ultraviolet (EUV) mask blank 30 is shown in a flowchart. The method 300 comprises at 310 heating a measurement region area of the EUV mask blank including a top side having multilayer stack which reflects EUV radiation. As described above herein, the measurement region area defined by a length and a width and comprising a plurality of sub regions, each of the plurality of sub regions comprising a sub region area smaller than that the measurement region area. At 312, the method comprises selectively heating at least one of the plurality of sub regions of the multilayer stack.

At 314 the method 300 comprises selectively heating at least one of the plurality of sub regions of the multilayer stack comprises heating at least a first of the plurality of sub regions of the multilayer stack to a first temperature T1 greater than at least a portion of the measurement region area.

In some embodiments, the method comprises selectively heating at least one of the plurality of sub regions of the multilayer stack, the first of the plurality of sub regions comprises a centroid wavelength (CWL) value that is elevated relative to a CWL value than the portion of the measurement area such that there is a CWL non-uniformity value. At 316, after the selectively heating at least one of the plurality of sub regions of the multilayer stack, the CWL non-uniformity value is reduced.

In some embodiments, the method comprises selectively heating more than one of the plurality of sub regions of the multilayer stack. In some embodiments, the selectively heating more than one of the plurality of sub regions of the multilayer stack comprises heating a first sub region of the multilayer stack to a first temperature and a second region of the multilayer stack.

At 318, heating a measurement region area of the EUV mask blank comprises irradiating the measurement region area with a top side radiation source. In some embodiments, the top side radiation source comprises an array of laser diodes directed at the top side, and at least a first portion of the array of laser diodes is separately controllable from a second portion of the array of laser diodes. In some embodiments, the top side radiation source comprises an array of heating lamps directed at the top side, and at least a portion of the array of heating lamps is separately controllable from a second portion of the array of heating lamps.

In some embodiments, the EUV mask blank further comprises a bottom side opposite the top side, and at 318 the method comprises heating the bottom side with a bottom side radiation source. In some embodiments, the bottom side radiation source comprises a plurality of heating elements. In some embodiments, the selectively heating at least one of the plurality of sub regions of the multilayer stack comprises heating at least a first of the plurality of sub regions of the multilayer stack to a first temperature greater than at least a portion of the measurement area.

In some embodiments, the selectively heating at least one of the plurality of sub regions of the multilayer stack is promoted by heating the EUV mask blank having a square shape while supported in a EUV mask blank carrier assembly comprising a top shied having an opening that does not comprise a square shape. In some embodiments, the top shield has an opening which comprises an irregular polygon shape or has curved corners.

Methods may generally be stored in the controller, which may comprise a processor and memory. The controller may utilize a software routine that, when executed by the processor, causes the apparatus to perform methods of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank comprising:
   heating a measurement region area of the EUV mask blank including a top side having multilayer stack which reflects EUV radiation, the measurement region area defined by a length and a width and comprising a plurality of sub regions, each of the plurality of sub regions comprising a sub region area smaller than that the measurement region area; and
   selectively heating at least one of the plurality of sub regions of the multilayer stack.

2. The method of claim 1, wherein the selectively heating at least one of the plurality of sub regions of the multilayer stack comprises heating at least a first of the plurality of sub regions of the multilayer stack to a first temperature greater than at least a portion of the measurement region area.

3. The method of claim 2, wherein prior to the selectively heating at least one of the plurality of sub regions of the multilayer stack, the first of the plurality of sub regions comprises a centroid wavelength (CWL) value that is elevated relative to a CWL value than the portion of the measurement area such that there is a CWL non-uniformity value.

4. The method of claim 3, wherein after the selectively heating at least one of the plurality of sub regions of the multilayer stack, the CWL non-uniformity value is reduced.

5. The method of claim 4, further comprising selectively heating more than one of the plurality of sub regions of the multilayer stack.

6. The method of claim 5, wherein the selectively heating more than one of the plurality of sub regions of the multilayer stack comprises heating a first sub region of the multilayer stack to a first temperature and a second region of the multilayer stack.

7. The method of claim 1, wherein heating a measurement region area of the EUV mask blank comprises irradiating the measurement region area with a top side radiation source.

8. The method of claim 7, wherein the top side radiation source comprises an array of laser diodes directed at the top side, and at least a first portion of the array of laser diodes is separately controllable from a second portion of the array of laser diodes.

9. The method of claim 7, wherein the top side radiation source comprises an array of heating lamps directed at the top side, and at least a portion of the array of heating lamps is separately controllable from a second portion of the array of heating lamps.

10. The method of claim 1, wherein the EUV mask blank further comprises a bottom side opposite the top side, and the method comprises heating the bottom side with a bottom side radiation source.

11. The method of claim 10, wherein the bottom side radiation source comprises a plurality of heating elements.

12. The method of claim 11, wherein the selectively heating at least one of the plurality of sub regions of the multilayer stack comprises heating at least a first of the plurality of sub regions of the multilayer stack to a first temperature greater than at least a portion of the measurement area.

13. The method of claim 1, wherein the selectively heating at least one of the plurality of sub regions of the multilayer stack is promoted by heating the EUV mask blank having a square shape while supported in a EUV mask blank carrier assembly comprising a top shied having an opening that does not comprise a square shape.

14. The method of claim 13, wherein the top shield opening comprises an irregular polygon shape.

15. An apparatus configured to selectively heat a portion of an EUV mask blank, the apparatus comprising:
- a chamber including a pedestal having a surface configured to support the EUV mask blank;
- a radiation source positioned and configured to direct radiation toward the surface configured to support the EUV mask blank; and
- a controller configured to control the radiation source to selectively direct heat toward a first region of the surface configured to support the EUV mask blank to a first temperature while maintaining a second region of the surface configured to support the EUV mask blank at a second temperature lower than the first temperature, the controller configured to execute a selective heating process based on a centroid wavelength non-uniformity profile of the EUV mask blank.

16. The apparatus of claim 15, further comprising a pedestal radiation source configured to selectively direct heat toward the first region, the surface configured to support the EUV mask blank heat to the first temperature while maintaining the second region of the surface configured to support the EUV mask blank at the second temperature, the pedestal radiation source in communication with the controller, which is further configured to send instructions for the pedestal radiation source to selectively direct the heat.

17. The apparatus of claim 16, the pedestal radiation source further comprising a plurality of heating elements.

18. The apparatus of claim 15, of claim 15, further comprising a top side radiation source configured to selectively direct heat toward the first region the surface configured to support the EUV mask blank and to heat to the first temperature while maintaining the second region of the surface configured to support the EUV mask blank at the second temperature, the top side radiation source in communication with the controller, which is further configured to send instructions for the top side radiation source to selectively direct the heat.

19. The apparatus of claim 18, wherein the top side radiation source comprises an array of laser diodes directed at the top side, and at least a first portion of the array of laser diodes is separately controllable from a second portion of the array of laser diodes by the controller.

20. The apparatus of claim 18, wherein the top side radiation source comprises an array of heating lamps directed at the top side, and at least a portion of the array of heating lamps is separately controllable from a second portion of the array of heating lamps.

* * * * *